United States Patent [19]

Welles et al.

[11] Patent Number: 5,177,691

[45] Date of Patent: Jan. 5, 1993

[54] MEASURING VELOCITY OF A TARGET BY DOPPLER SHIFT, USING IMPROVEMENTS IN CALCULATING DISCRETE FOURIER TRANSFORM

[75] Inventors: Kenneth B. Welles, Scotia; Richard I. Hartley, Schenectady, both of N.Y.

[73] Assignee: General Electric Company, Schenectady, N.Y.

[21] Appl. No.: 620,511

[22] Filed: Nov. 30, 1990

[51] Int. Cl.$^5$ .................... G06F 15/31; G06F 15/332
[52] U.S. Cl. ........................ 364/485; 364/413.25; 364/572; 364/576; 364/726
[58] Field of Search ........... 364/485, 565, 726, 413.02, 364/413.03, 413.05, 413.20, 413.25; 341/122

[56] References Cited

U.S. PATENT DOCUMENTS

| | | | |
|---|---|---|---|
| 3,791,590 | 12/1988 | Ku et al. | 364/726 |
| 4,556,067 | 12/1985 | Hokanson et al. | 364/485 X |
| 4,689,762 | 8/1987 | Thibodeau, Jr. | 364/726 |
| 4,730,257 | 3/1988 | Szeto | 364/484 |
| 4,760,549 | 7/1988 | Delalande et al. | 364/726 |
| 4,787,055 | 11/1988 | Bergeon et al. | 364/726 |
| 4,809,184 | 2/1989 | O'Donnell et al. | 364/413.25 |
| 4,831,570 | 5/1989 | Abiko | 364/715.01 |
| 4,839,652 | 6/1989 | O'Donnell et al. | 341/122 |
| 4,866,613 | 9/1989 | Amemiya et al. | 364/413.25 |
| 4,918,605 | 4/1990 | Shirasaka | 364/413.25 |
| 4,972,358 | 11/1990 | Welles II et al. | 364/726 |

OTHER PUBLICATIONS

D. W. Baker, "Pulsed Ultrasonic Doppler Blood-Flow Sensing", IEEE Transactions on Sonics & Ultrasonics, vol. SU-17, No. 3, pp. 170-185, Jul. 1970.

P. A. Bello, "Some Techniques for the Instantaneous Real-Time Measurement of Multipath and Doppler Spread", IEEE Transactions on Communication Technology, vol. 13, No. 3, pp. 285-292, Sep. 1965.

"A Mathematical Approach to Modelling the Flow of Data & Control in Computational Networks", L. Johnsson & D. Cohen, VLSI Systems & Computations, H. T. Kung et al., pp. 213-225, Computer Science Press, Rockville, MD 1981.

L. R. Rabiner & B. Gold, "Theory and Application of Digital Signal Processing", Prentice Hall, Englewood Cliffs, NJ, pp. 50-57.

F. J. Harris, "On the Use of Windows for Harmonic Analysis with the Discrete Fourier Transform", Proceedings of the IEEE, vol. 66, No. 1, Jan. 1978, pp. 51-83.

Primary Examiner—Kevin J. Teska
Attorney, Agent, or Firm—Lawrence P. Zale; Marvin Snyder

[57] ABSTRACT

The invention is embodied in improvements in calculating discrete Fourier transform (DFT) using recursive digital filtering in a method for determining the velocity of a target located in a medium for vibratory energy. In the method a transmitter electrical signal of prescribed frequency is generated. Coherent vibratory energy, the frequency of which is in fixed relationship with said prescribed frequency, is transmitted into the medium and is directed toward the target. The transmitting is done in recurring pulses of prescribed duration. During range gate intervals each of prescribed duration, the transmitted coherent vibratory energy is received from the medium after its interaction with the target. The vibratory energy which is received during the range gate intervals is converted to a receiver electrical signal. The transmitter and receiver electrical signals are mixed together to obtain a demodulated electrical signal through heterodyning or homodyning. The demodulated electrical signal is digitized and then digitally filtered on a recursive basis to separate it into digitized spectral components in accordance with a discrete Fourier transform procedure. Squaring the absolute value of each of the digitized spectral components generates digital electric signals descriptive of the power spectrum of the interaction of the vibratory energy with said target. After performing a comparative analysis of the digital electric signals descriptive of that power spectrum, the velocity of the target is calculated from the results of the comparative analysis.

15 Claims, 2 Drawing Sheets

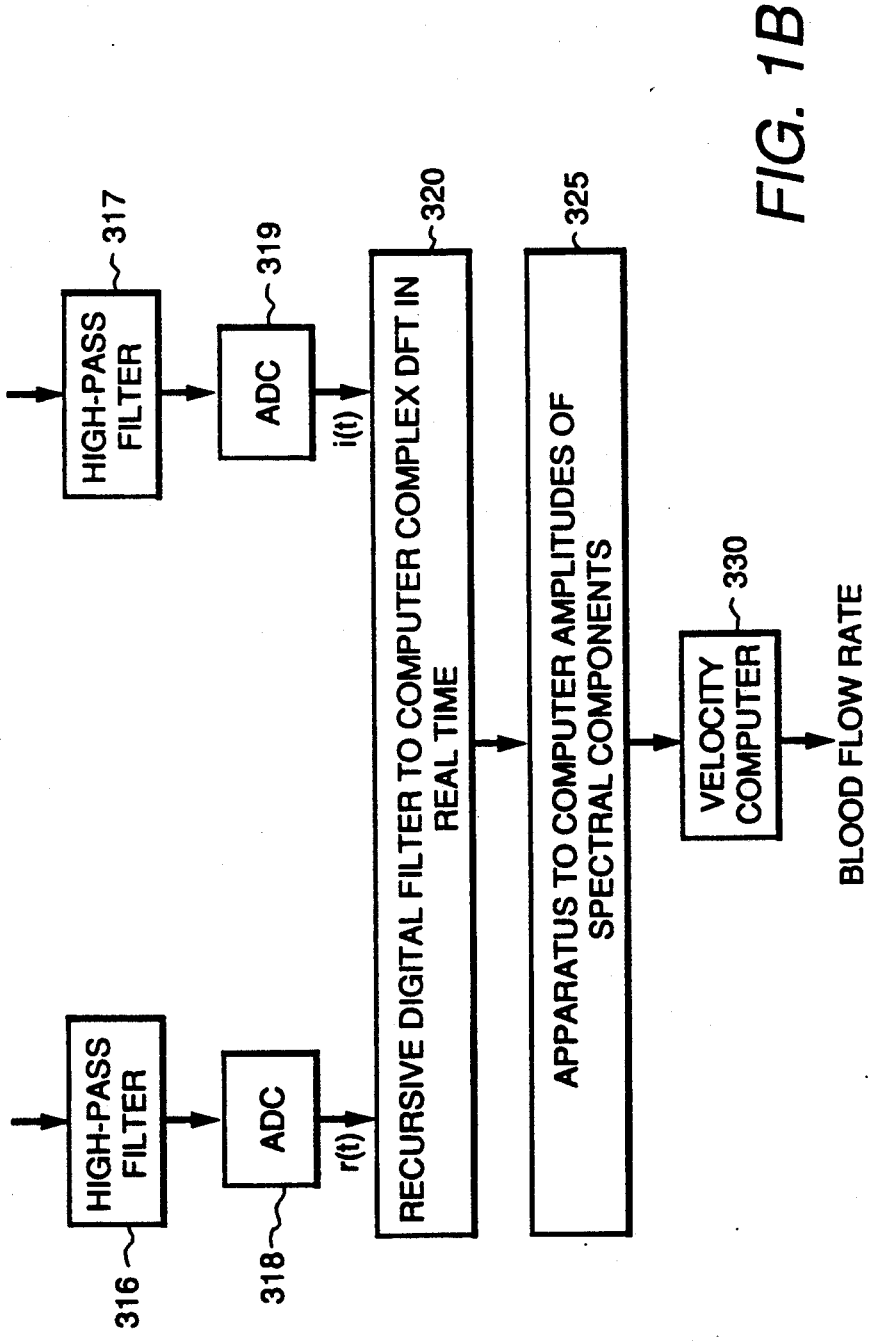

MEASURING VELOCITY OF A TARGET BY DOPPLER SHIFT, USING IMPROVEMENTS IN CALCULATING DISCRETE FOURIER TRANSFORM

The present invention relates to improvements in calculating discrete Fourier transform (DFT) in a method of measuring velocity of a target by Doppler shift of reflections of a beam of vibratory energy directed toward the target location. The target may by way of example be a sample volume with a flow of energy scatterers therethrough, such as blood flow through a blood vessel in a human being being subjected to medical ultrasound diagnostic procedures.

BACKGROUND OF THE INVENTION

The most commonplace example of the method of measuring velocity of a target by Doppler shift is probably the Doppler radar used by police departments to detect vehicles exceeding speed limits. Finding the discrete Fourier transform (DFT) of the demodulated Doppler radar returns separates the return into components falling into different frequency bins. The first moment of the power spectrum represents the Doppler frequency shift and the variance characterizes the spectral spreading; in completing the processing of the power spectrum the Doppler frequency shift and spectral spreading parameters can be converted to velocity measurements using the fundamental Doppler equation. This method is of interest in a number of other Doppler ranging systems, such as ones providing for the quantitative characterization of blood flow by Doppler ultrasound.

D. W. Baker describes the Doppler detection of pulsed ultrasound being used to map fluid flows in models and transcutaneously in the blood vessels of human beings in the paper "pulsed Ultrasonic Doppler Bloodflow sensing", IEEE Transactions on Sonics and Ultrasonics, Vol. SU-17, No. 3, July 1970, pp. 170-185. In medical ultrasound, many diagnostic procedures begin from the determination of the power spectrum of the returning signal. Certain of these diagnostic procedures, such as the quantitative characterization of blood flow by Doppler ultrasound, can provide better diagnostic precision if the power spectrum can be derived at the same sampling rate as that of the incoming signal. Attempting to do this real-time spectral analysis with a dedicated computer using known fast Fourier transform procedures has previously been inordinately expensive in terms of digital hardware and of the power consumption by that hardware, when attempting to meet speed requirements. Accordingly, the development of more refined medical diagnoses using ultrasound has been hampered.

The inventors describe dedicated hardware for performing fast Fourier transform in their U.S. Pat. No. 4,972,358 entitled "COMPUTATION OF DISCRETE FOURIER TRANSFORM USING RECURSIVE TECHNIQUES", issued Nov. 20, 1990 and incorporated in its entirety herein.

SUMMARY OF THE INVENTION

The invention is embodied in improvements in calculating discrete Fourier transform (DFT) in a method for determining the velocity of a target located in a medium for vibratory energy, calculating being done using recursive digital filtering, rather than transversal digital filtering. In the method for determining the velocity of a target a transmitter electrical signal of prescribed frequency is generated. Coherent vibratory energy, the frequency of which is in fixed relationship with said prescribed frequency, is transmitted into the medium and is directed toward the target. The transmitting is done in recurring pulses of prescribed duration. During range gate intervals each of prescribed duration, the transmitted coherent vibratory energy is received from the medium after its interaction with said target. Each of the range gate intervals follows a respective one of said recurring pulses of transmitted vibratory energy after a prescribed time interval has elapsed, and the vibratory energy which is received during the range gate intervals is converted to a receiver electrical signal. The transmitter and receiver electrical signals are mixed together to obtain a demodulated electrical signal through heterodyning or homodyning. The demodulated electrical signal is digitized and then digitally filtered on a recursive basis to separate it into digitized spectral components in accordance with a discrete Fourier transform procedure. Squaring the absolute value of each of the digitized spectral components generates digital electric signals descriptive of the power spectrum of the interaction of the vibratory energy with said target. After performing a comparative analysis of the digital electric signals descriptive of that power spectrum, the velocity of the target is calculated from the results of the comparative analysis.

BRIEF DESCRIPTION OF THE DRAWING

FIGS. 1A and 1B together form a schematic diagram of a prior-art ultrasound Doppler ranging system for measuring velocity of blood flow, improved to calculate DFT on a recursive basis in accordance with the precepts of the invention.

DETAILED DESCRIPTION OF THE INVENTION

Figure 1A:
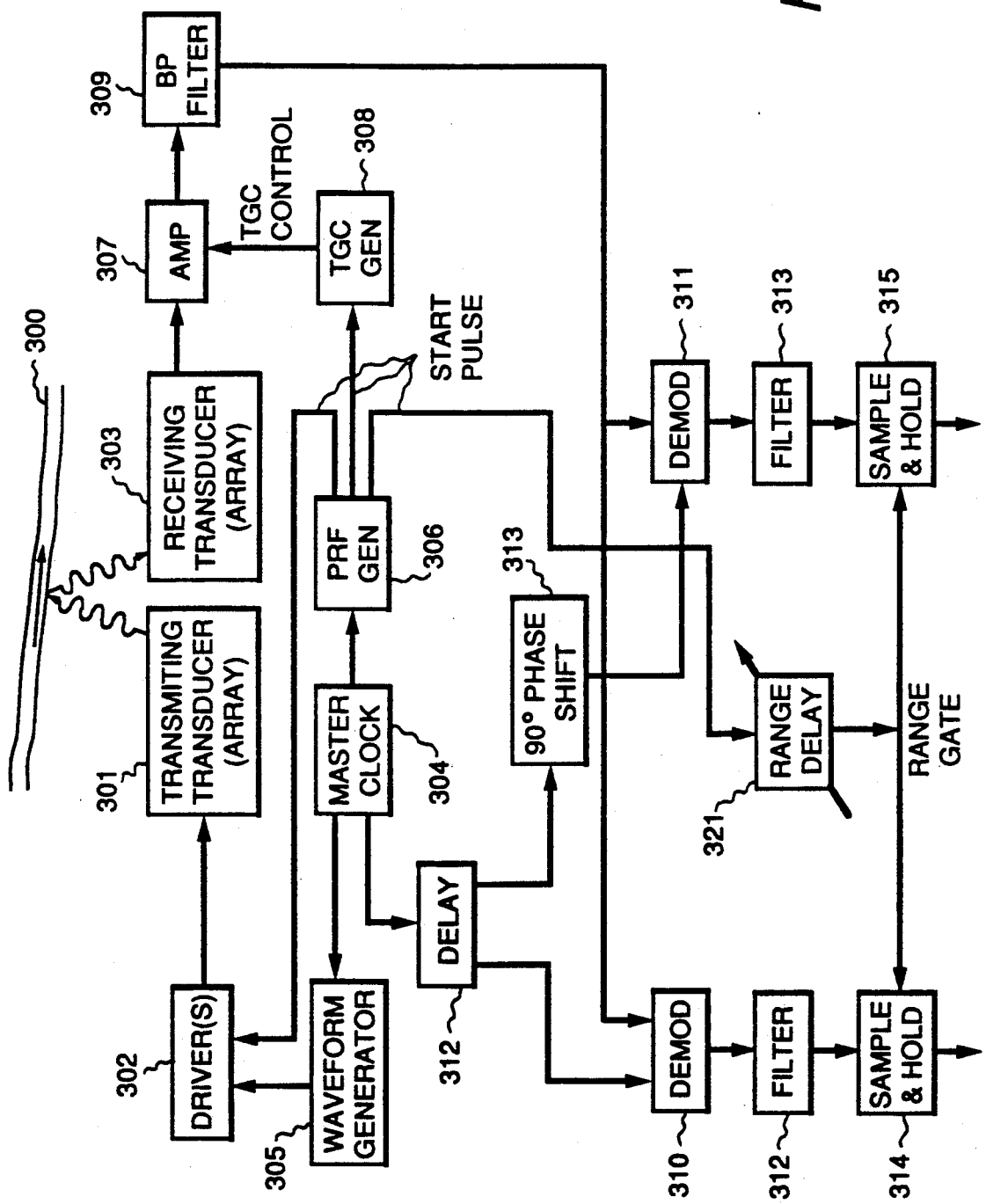

The ultrasound Doppler ranging system as shown in FIGS. 1A and 1B measures frequency shifts in the portions of an ultrasound beam back-scattered from a sample volume 300 containing at least one scatterer. The sample volume is analogous to the target of a Doppler radar, and in the claims to the invention the volume of scatters will be denominated as "target". Sample volume 300 may, by way of example, be a volume of blood flow through the lumen of a blood vessel. The ultrasound beam is shown as being generated by one or more transmitting transducers 301 responsive to transmitter electrical signal(s) supplied thereto from one or more respective driving amplifiers 302, and the ultrasound back-scattered from a scatterer 300 is shown as being converted to a received electrical signal by one or more receiving transducers 303. The transmitting and receiving transducers are paired, the transducers in each pair being located in close proximity to each other. Alternative arrangements using the same transducers with a transmit/receive switch apparatus, both for transmitting at certain times and for receiving at other times, are also known in ultrasound Doppler ranging systems.

The lateral resolution of the sampling volume is determined by the width of the ultrasound beam, which width is determined by the aperture of the transmitting transducer 301. In a continuous wave (CW) Doppler ranging system the axial resolution of the sampling volume is the full length of the ultrasound beam, so to obtain a small sample volume (i.e., good spatial resolution) a plurality of transmitter transducers must be used, with the intersection of their ultrasound beams defining the sample volume. In a pulsed Doppler ranging system, on the other hand, the finite duration of each pulsing of the transmitted ultrasound beam helps define axial resolution. The transducer ringdown response will also affect sample volume somewhat, causing the sample volume to have a teardrop shape with its point directed towards the transducer. For a 2.5 MHz, f/4 transducer a typical sample volume in a pulsed Doppler ultrasound ranging system is on the order of 8.5 mm$^3$. A small blood vessel will fit entirely within such a sample volume, but larger blood vessels may be scanned to generate blood velocity profiles.

For the ultrasound Doppler ranging system as shown in FIGS. 1A and 1B to make an accurate measurement of the frequency shifts in the back-scattered portions of an ultrasound beam, it must transmit coherent sound waves that are well defined in frequency and in time. A master clock generator 304 that typically includes a crystal oscillator is used to time the system components. The master clock generator 304 controls the frequency of electrical waveforms generated by a waveform generator 305, which sinusoidal waveforms are selectively applied to the one or more transmitting transducers 301 via the one or more respective driving amplifiers 302. This selective application is made responsive to start pulses applied to the one or more respective driving amplifiers 302 from a pulse repetition frequency generator 306, which generator is phase- and frequency-locked from the master clock generator 304.

The received electrical signal generated by one or more receiving transducers 303 responsive to the back-scattered ultrasound beam from the sample volume 300 and supplied to an amplifier 307 has an eighty to ninety dB dynamic range. Unless the amplifier 307 has a non-linear response, such as a logarithmic response, some form of real-time variable gain control has to be provided for the amplifier 307. Saturation of amplifier 307 must be avoided or valuable Doppler shift information will be lost. In FIG. 1A the start pulses from the pulse repetition frequency generator 306 are supplied to a time-gain control generator 308, which generates a real-time variable gain control signal for the amplifier 307. The time-gain control generator 308 preferably provides for discontinuing the application of input signal to the amplifier 307 during the pulsed transmission of the ultrasound beam to avoid overload of and possible damage to the amplifier 307. Gating of the input port with a Schottky diode bridge is preferable because of their fast recovery time and the cancellation of noise transients. The amplitude of strong near-field returns to the input port of the amplifier 307 should be limited, A reverse parallel connection of Schottky diodes is preferred as a limiter.

A band-pass filter 309 is used to constrain the output bandwidth of the amplifer 307, as a noise-reduction measure. In a pulsed Doppler ranging system the upper cut-off frequency of the band-pass filter 309 is set just above the frequency where effective sample volume would be stretched to result in a loss of resolution from the maximum available for the number of cycles in each transmitted ultrasound pulse. The lower cut-off frequency of the band-pass filter 309 is usually capable of being set according to the option of the system operator.

The band-pass filter 309 will also suppress harmonic distortion components arising from any non-linearity of amplifer 307. If amplifier 307 is non-linear, band-pass filtering of its input signals is also necessary, to prevent intermodulation distortion being generated within amplifier 307.

The band-pass filtered response of amplifer 307 is supplied from filter 309 to the signal input port of an in-phase demodulator 310 and a quadrature demodulator 311. The in-phase demodulator 310 synchronously detects the band-pass filtered response of amplifer 307 using a carrier obtained via a delay network 312 from the master clock generator 304. Synchronous detection may be directly to baseband by homodyning the band-pass filtered response of amplifer 307 with an unmodulated carrier of the same frequency and phase as its own component carrier; or, alternatively, synchronous detection may be by heterodyning a different carrier frequency with the band-pass filtered response of amplifer 307. The homodyning procedure destroys information concerning the sense of the Doppler shift in Doppler ranging systems similar to that of FIG. 1 except for dispensing with quadrature demodulator 311 and elements 313, 315, 317 and 319 cascaded thereafter. However, the heterodyning procedure preserves that information.

The information concerning the sense of the Doppler shift in the Doppler ranging system of FIGS. 1A and 1B is preserved in either case through use of the phase-coherent quadrature demodulator 311. The quadrature demodulator 311 synchronously detects the band-pass filtered response of amplifer 307 using a carrier phase shifted ninety degrees (conventionally in the lag direction) from the carrier phase used by the in-phase demodulator 310. Synchronous detection in the quadrature demodulator 311 is by homodyning or by heterodyning in accordance with synchronous detection in the in-phase demodulator 310.

The demodulated electrical signals generated by mixing in the in-phase demodulator 310 and quadrature demodulator 311 are supplied as input signals to filters 312 and 313, which suppress image and harmonic spectra. Where synchronous detection in the in-phase demodulator 310 and quadrature demodulator 311 is by homodyning to baseband, the filters 312 and 313 are low-pass filters; and these low-pass filters 312 and 313 can also suppress carrier remnants. Where synchronous detection in the in-phase demodulator 310 and quadrature demodulator 311 is by heterodyning, the filters 312 and 313 are band-pass filters and suppression of carrier is best done using doubly-balanced synchronous detection in which both modulated-carrier input signal and input unmodulated carrier are balanced against in the detection output signals. Good phase linearity is necessary in the filters 312 and 313 to preserve the integrity of Doppler shift information.

The output signals from the filters 312 and 313 represent the acoustic energy scattered from red blood cells. These output signals are the real and imaginary components of a complex signal that contains the Doppler phase shift information associated with the velocity component of the flow field in the direction of the beam. The frequency spectrum of this complex signal taken over the region representing the blood vessel lumen provides the average velocity across the vessel. In principle, velocity can be determined at various locations within a larger blood vessel as well. However, the accuracy of this type of measurement is poor because of the time-bandwidth uncertainty principle. The fundamental problem is that the transmitted pulse is very narrow in time. This means it contains a wide spectrum. A typical pulse 1 μs wide will have significant frequency components over a band of 500 KHz. The system must be very stable and the signal-to-noise ratio must be very good in order to resolve frequency shifts of 1 kHz or less.

The Doppler ranging system cascades sample-and-hold circuits 314 and 315 after filters 312 and 313 FIG. 1A respectively. The start pulse from the PRF generator 306, as delayed by an operator-set amount in the range delay circuit 321 causes the sample-and-hold circuits 314 and 315 to sample the output signals of filters 312 and 313 at PRF rate. By sampling at PRF rate the real and imaginary components of the complex signal that contains the Doppler phase shift information associated with the velocity component of the flow field in the direction of the beam, and by performing these recurrent samplings with uniform delays respective to the start pulses from the PRF generator 306 for a number of successive pulses, however, the governing time of the time-bandwidth uncertainty principle is that of the pulse-to-pulse period. Since this time, referred to as "slow time," is significantly longer than the pulse width (which sets the scale of "fast time"), frequency resolution is much better. The fact that the Doppler frequency shift represents a very small fraction of the transmitted acoustic frequency but a relatively large fraction of the pulse repetition frequency is the basic principle of a range-gated, phase-coherent pulsed Doppler system.

Slow time processing does suffer from certain limitations, however. The range gating and sampling at a given flow point allows measurement at only one point within the vessel, and then only if the walls of the vessel do not move appreciably over many pulse repetition intervals. The flow profile across the vessel can be measured, but only by changing the range gate. To compare this profile to that of the true profile requires the assumption that the system is quasi-stationary over the time period of the measurement. Of course, it is possible to build a system which samples points at many range gate positions simultaneously. This type of system, although complex, is rapidly becoming economically practical as the state of the art of digital and analog technology is advancing.

In a typical sample-and-hold scheme, the value of the input signal at the end of the sample aperture time is maintained or held until the next sample is taken one pulse repetition interval later. Signal amplitude is maintained since no averaging occurs. The gain rolls off near the Nyquist frequency, however, due to the low-pass filter effect of the sample-and-hold. If analog signal processing is used, then compensation must be made for this low-pass filter response. When digital signal processing is used, the sample-and-hold is used only to provide a constant value to the input of the analog-to-digital converter (A/D) during its conversion time. The effective system frequency response is the same as that of impulse sampling since the converter digitizes the instantaneous value of the input signal at the hold time. If A/D conversion is done, low-pass filtering should not be done between the sample-and-hold and the A/D converter since this filter will only smooth sampling noise into the output signal.

The sampling circuit must be able to acquire the true value of the signal at the proper sampling time and, if followed by a hold circuit, hold this value with minimum droop until the next sample. To acquire the signal, it must have a sufficiently high slew rate and bandwidth to follow the signal within specified system accuracy. Aperture delay time, delay time jitter, and aperture hold time must be carefully controlled, since any variation in these parameters is reflected directly as a phase modulation in Doppler signal output.

Once sampling has occurred, the settling time of the hold circuit must expire before A/D conversion can be accomplished. Especially for high sensitivity samplers, the feedthrough of input signal during the hold period can cause a measurable error. In addition, when the signal is to be converted to digital form, the hold output should not droop more than ½ bit during the conversion aperture time.

Precision sampling is best done with a two-stage sampler where the second sampler is delayed with respect to the first. The first stage samples the time signal. The second stage, after a small gain to preserve dynamic range, samples the output of the first sampler. This eliminates any pulse due to sampler feed-through and reduces droop.

As with the demodulator, the sample circuit can be followed by a sharp roll-off low-pass filter to remove harmonics of the sampling frequency. The type of the filter used will depend greatly on the method of signal detection. Where it is desirable to preserve phase information, Bessel or transitional filters should be used. If the frequencies are to be detected with a bank of narrow band filters, then a Chebychev filter may be more desirable. The sharp roll-off low-pass filter after the sample circuit is not needed and can actually be detrimental, however, if the hold data is to be subsequently digitized as shown in FIG. 1B.

It is generally desirable to pass the output signals from the sample-and-hold circuits 314 and 315 through respective high-pass filters 316 and 317, in order to suppress low-frequency components such as vessel wall or heart wall motion and breathing motions. The low-frequency cut-off of high-pass filters 316 and 317 is typically on the order of 100 Hz, depending upon the application and the transmission frequency. The high-pass filters 316 and 317 also remove the dc term caused by fixed scatterers. If as shown in FIG. 1B analog-to-digital converters 318 and 319 converter follow the high-pass filters 316 and 317 in cascade, removing the dc component in the input signals to the analog-to-digital converters 318 and 319 reduces the dynamic range requirements of the converters. If the cut-off frequency is high, care must be exercised so that the signal does not exhibit excessive droop during the conversion time. The possibility of excessive droop can be avoided by inserting further sample-and-hold circuitry (not shown in FIG. 1B) following the high-pass filters 316 and 317.

Modern, low-cost digital signal processing makes it very desirable to use digital techniques for filtering and signal extraction. Key element in the processing chain are the analog-to-digital (A/D) converters 318 and 319. The converters should be selected to provide full accuracy conversion during the PRF interval. With present technology, it is possible to multiplex a single analog-to-digital converter between both the in-phase and quadrature channels of a complex demodulator, permitting a converter with a wider dynamic range (i.e., more bits) to be used without a significant increase in cost.

The input range required in the analog-to-digital converter(s) is a tradeoff between cost and the desire to preserve accuracy and low-frequency signals. If the outputs of the sample-and-hold circuits 314 and 315 are not high-pass filtered, then an increase in dynamic range of 20 to 30 dB (3 to 5 bits) may be required due to the large dc signal from stationary scatterers. In general, the dynamic range is determined by the noise level at the input to the analog-to-digital converter(s).

As an example, consider a system using a 256-point DFT and sampling at a PRF of 10 KHz. This system has a frequency bin width of 39 Hz. If one assumes the noise is limited by the thermal noise of a 1 KΩ transducer, the effective bandwidth is 39 Hz, and the system gain is 100 dB, then the rms noise voltage at the input to the converter is 2.5 mV. If the dynamic range of the amplifier is 5 V peak, then the peak signal to noise is $$\frac{S_{pk}}{N_{rms}} = 2 \times 10^3 \text{ or } 66 \text{ dB}$$

This corresponds to eleven bits plus a sign bit, or a 12-bit analog-to-digital converter.

The real portion r(t) and imaginary portion i(t) of the Doppler return as provided from the analog-to-digital converters 318 and 319 are supplied to a computer 320 to generate the complex discrete Fourier transform of the Doppler return in real time. Generally speaking, general-purpose, programmable computers are too slow to generate the complex discrete Fourier transform of the Doppler return in real time. The computer 320 is preferably one of the dedicated, non-programmable computers as described in connection with FIGS. 1, 2, 3, 4a and 4b, 5, 7, 8, 9 or 10, of U.S. Pat. No. 4,972,358 but it may be a high-speed microcomputer programmed to perform calculations of the DFT using similar algorithms.

The computer 320 is followed by apparatus 325 that squares the absolute value of each Doppler spectrum component to generate a power spectrum. As noted in U.S. Pat. No. 4,972,358, the square of the absolute value of each Doppler spectrum component can be obtained by summing the square of its real component and the square of its imaginary component. The resulting power spectrum from the apparatus 325 is supplied to a computer 330 that computes the velocity of the target in accordance with the Doppler formula; this velocity corresponds to blood flow rate in the ultrasound Doppler ranging system of FIGS. 1A and 1B in which the target is a sample volume of blood flow through a blood vessel. The computer 330 is of a type known in the art, being either a special-purpose dedicated computer or a microprocessor programmed to compute the velocity of the target in accordance with the Doppler formula, beginning from the power spectrum of the Doppler return from the apparatus 325. There are a number of techniques available to estimate directly either the average velocity of the target or the velocity spread of the target. One of these techniques described in the P. A. Bello paper "Some Techniques for the Instantaneous Real Time Measurement of Multipath and Doppler Spread", *IEEE Transactions on Communications Technology,* Vol. 13 pp. 285–292, 1965, includes a correlation centroid detector. A single high-speed computer may, of course, replace elements 320, 325 and 330.

The blood flow rate measurement may be made available to the human observer as a meter reading, as part of a cathode-ray-tube display or similar display, or as an auditory tone having a pitch related to blood flow rate. The blood flow rate measurement is typically calculated as the centroid of the velocity spread—i.e., the summation of the first moments of the velocity bins divided by the summation of the zeroeth moments of the velocity bins. The first moment of each velocity bin is the product of its power times the difference of its velocity from a reference velocity, and the zeroeth moment of each velocity bin is simply the value of its power. When a cathode-ray-tube display or similar display is to be generated, the power for the various velocity bins is displayed as vertical deflection and the horizontal deflection accords with the sequential sampling of the various velocity bins. The centroid of the velocity spread is calculated and is superposed as a vertical marker on the display. The spectral spread of the display is a measure of the turbulence of the blood flow, and digital calculations of the variance of the spectrum may be made to provide a blood turbulence measurement that supplements the display.

Variants of ultrasound Doppler ranging systems for measuring blood flow are known which variants use digital signal processing in the demodulation of the receiver electrical signal. In accordance with the invention, the operation of these variants can be improved by calculating the discrete Fourier transform in the manner taught in U.S. Pat. No. 4,972,358.

M. O'Donnell and M. G. Magrane in U.S. Pat. No. 4,809,184 issued Feb. 28, 1989, entitled "METHOD AND APPARATUS FOR FULLY DIGITAL BEAM FORMATION IN A PHASED ARRAY COHERENT IMAGING SYSTEM", assigned to General Electric Company and incorporated in its entirety herein describe a method for steering a beam of vibratory energy to a desired angle $\theta$ with respect to the plane of an array of transducers, uses apparatus which generates a plurality of sampling strobe sequences with each strobe pulse occurring at a time interval T after the preceding strobe pulse, where T satisfies the Nyquist condition. A different one $S_j$ of the strobe signals is assigned to each different transducer channel and the commencement time of the strobe signal in each channel is offset by a time interval which is a first positive integer multiple $M_j$, selected for each angle $\theta$, of an offset time interval which is not greater than 1/32nd of the reciprocal of the ultrasonic excitation frequency $F_u$. Each strobe signal triggers conversion of the present amplitude of the return signal directly to a digital data word; the apparatus then digitally delays each data word in each of the N channels for a delay time interval selected to cause the delayed data words from all N channels, when coherently summed, to represent any change in reflectance in the beam at the desired angle $\theta$.

M. O'Donnell and M. G. Magrane in U.S. Pat. No. 4,839,652 issued Jun. 13, 1989, entitled "METHOD AND APPARATUS FOR HIGH SPEED DIGITAL PHASED ARRAY IMAGING SYSTEM", assigned to General Electric Company and incorporated in its entirety herein describe a method for generating an output stream of digital data words, which each data word representing the amplitude of an analog signal at one of a multiplicity of F samples each second and with substantially equally spaced time intervals T therebetween, is obtained from a digital baseband demodulation system used for array beam forming. A data stream, formed of interleaved ADC output digital data words acquired from a set of converters, is at a rate of F total samples/second. Subsequent digital demodulation, filtration, and decimation provides digital output signals which need less delay resolution prior to the formation of coherent sum signals, thereby reducing overall channel memory requirements. The output baseband data stream has enhanced dynamic range, thereby reducing the ADC bit density requirements.

The improvements of the invention with regard to the calculation of DFT for generating the complex spectrum of Doppler returns in a Doppler ranging system find application in a wide range of Doppler ranging systems, and this should be borne in mind when construing the scope of the claims which follow.

What is claimed is:

1. A method for determining the velocity of a target located in a medium which method comprises the steps of:

generating a transmitter electrical signal of prescribed frequency;

transmitting into said medium coherent vibratory energy which is directed toward said target, said coherent vibratory energy being of a frequency in fixed relationship with said prescribed frequency, said transmitting being done in recurring transmission pulses of prescribed duration; receiving from said medium during intervals between said recurring transmission pulses said transmitted coherent vibratory energy after its interaction with said target;

converting to a receiver electrical signal said received coherent vibratory energy;

processing said receiver electrical signal to obtain a digital demodulated electrical signal indicative of the phase and frequency differences between said transmitter electrical signal and said receiver electrical signal;

digitally filtering said digital demodulated electrical signal on a recursive basis to separate it into a plurality k in number of complex digital spectral components with a discrete Fourier transform procedure, said k complex digital spectral components having respective consecutive ordinal numbers selected from the consecutive ordinal numbers zeroeth through $(N-1)$th, N being a positive integer at least two, said step of digitally filtering being repeated on a recursive basis and comprises for each digital spectral component the respective substeps of:

combining each sample of said demodulated electrical signal with a complex sample of a respective other signal to generate a complex sample of said digital spectral component of the discrete Fourier transform; and multiplying said complex sample of said spectral component by a fraction less than one of an Nth root of unity, to generate the next complex sample of said other signal;

squaring an absolute value of each complex sample of said complex digital spectral components to generate digital electric signals descriptive of the amplitudes of the power spectrum of the interaction of said vibratory energy with said target;

performing a comparative analysis of said digital electric signals descriptive of the amplitudes of the power spectrum of the interaction of said vibratory energy with said target; and calculating the velocity of said target from the results of said comparative analysis.

2. The method for determining the velocity of a target of claim 1 wherein each said substep of combining is additive and wherein in each said substep of multiplying said complex sample of said spectral component by a fraction less than one of a said Nth root of unity, said fraction less than one is the same positive fraction and said Nth root of unity is chosen to be $e^{-j2\pi k/N}$, with k being the ordinal number of said digital spectral component of the discrete Fourier transform being generated by substeps including that particular said substep of multiplying.

3. A method for determining the velocity of a target located in a medium, which method comprises the steps of:

generating a transmitter electrical signal of prescribed frequency;

transmitting into said medium coherent vibratory energy which is directed toward said target, said coherent vibratory energy being of a frequency in fixed relationship with said prescribed frequency, said transmitting being done in recurring transmission pulses of prescribed duration;

receiving from said medium during intervals between said recurring transmission pulses said transmitted coherent vibratory energy after its interaction with said target;

converting to a receiver electrical signal said received coherent vibratory energy;

processing said receiver electrical signal to obtain a digital demodulated electrical signal indicative of the phase and frequency differences between said transmitter electrical signal and said receiver electrical signal;

digitally filtering said digital demodulated electrical signal to separate it into complex digitized spectral components with a discrete Fourier transform procedure, said step of digitally filtering being repeated on a recursive basis and comprises the substeps of:

latching each sample of said demodulated electrical signal for the period of k successive calculations during each of which calculations a respective one of k spectral components of the discrete Fourier transform of said demodulated electrical signal is calculated, said k spectral components having respective consecutive ordinal numbers selected from the consecutive ordinal numbers zeroeth through $(N-1)$th, N being a positive integer at least two;

combining, with said latched sample of said demodulated electrical signal, a respective complex number during each of said k successive calculations, thereby to generate a correspondingly numbered one of said complex digital spectral components of the discrete Fourier transform; and multiplying said correspondingly numbered one of said complex digital spectral components by a fraction less than one of an Nth root of unity, to generate the next complex sample of said respective complex number;

squaring an absolute value of each of the complex digitized spectral components to generate digital electric signals descriptive of the power spectrum of the interaction of said vibratory energy with said target;

performing a comparative analysis of said digital electric signals descriptive of the power spectrum of the interaction of said vibratory energy with said target; and calculating the velocity of said target from the results of the comparative analysis of said digitized spectral components.

4. The method for determining the velocity of a target of claim 3 wherein said substep of combining is additive and wherein in said substep of multiplying said correspondingly numbered one of said complex digital spectral components by a fraction less than one of a said Nth root of unity, said fraction less than one is the same positive fraction and said Nth root of unity is chosen to be $e^{-j2\pi k/N}$, with k being the ordinal number of said successive calculation.

5. A method for determining the velocity of a target located in a medium, which method comprises the steps of:

generating a transmitter electrical signal of prescribed frequency;

transmitting into said medium coherent vibratory energy which is directed toward said target, said coherent vibratory energy being of a frequency in fixed relationship with said prescribed frequency, said transmitting being done in recurring transmission pulses of prescribed duration;

receiving from said medium during intervals between said recurring transmission pulses said transmitted coherent vibratory energy after its interaction with said target;

converting to a receiver electrical signal said received coherent vibratory energy;

processing said receiver electrical signal to obtain a digital demodulated electrical signal indicative of the phase and frequency differences between said transmitter electrical signal and said receiver electrical signal;

digitally filtering said digital demodulated electrical signal to separate it into a plurality k in number of complex digital spectral components in accordance with a discrete Fourier transform procedure, said k complex digital spectral components having respective consecutive ordinal numbers selected from the consecutive ordinal numbers zeroeth through (N−1)th, said step of digitally filtering comprises the substep of digitally filtering said digitized demodulated electrical signal on a recursive basis to convolve it with a window N samples wide, N being a positive integer at least two; and further comprises for each digital spectral component the respective substeps of:

combining each sample of said demodulated electrical signal, as windowed by said rectangular window N samples wide, with a complex-number sample of a respective other signal identified by the same ordinal number as said digital spectral component being separated, thereby to generate each sample of said digital spectral component being separated; and multiplying said complex-number sample of said spectral component by a number substantially equal to an Nth root of unity to generate the next complex-number sample of said respective other signal identified by the same ordinal number as said digital spectral component being separated;

squaring an absolute value of each complex sample of said complex digital spectral components to generate digital electric signals descriptive of the amplitudes of the power spectrum of the interaction of said vibratory energy with said target;

performing a comparative analysis of said digital electric signals descriptive of the amplitudes of the power spectrum of the interaction of said vibratory energy with said target; and calculating the velocity of said target from the results of said comparative analysis.

6. The method for determining the velocity of a target of claim 5 wherein said substep of digitally filtering said digitized demodulated electrical signal on a recursive basis to convolve it with a window N samples wide consists of a substep of digitally filtering said digitized demodulated electrical signal on a recursive basis to convolve it with a rectangular window N samples.

7. The method for determining the velocity of a target of claim 5 wherein said substep of digitally filtering said digitized demodulated electrical signal on a recursive basis to convolve it with a window N samples wide consists of a substep of digitally filtering said digitized demodulated electrical signal on a recursive basis to convolve it with a triangular window N samples wide.

8. The method for determining the velocity of a target of claim 5 wherein each said substep of multiplying said Nth root of unity is chosen to be $e^{-j2\pi k/N}$, with k being the ordinal number of said digital spectral component of the discrete Fourier transform being generated by substeps including that particular said substep of multiplying.

9. A method for determining the velocity of a target located in a medium, which method comprises the steps of:

generating a transmitter electrical signal of prescribed frequency;

transmitting into said medium coherent vibratory energy which is directed toward said target, said coherent vibratory energy being of a frequency in fixed relationship with said prescribed frequency, said transmitting being done in recurring transmission pulses of prescribed duration;

receiving from said medium during intervals between said recurring transmission pulses said transmitted coherent vibratory energy after its interaction with said target;

converting to a receiver electrical signal said received coherent vibratory energy;

processing said receiver electrical signal to obtain a digital demodulated electrical signal indicative of the phases and frequency differences between said transmitter electrical signal and said receiver electrical signal;

digitally filtering said digital demodulated electrical signal to separate it into complex digitized spectral components with a discrete Fourier transform procedure, said step of digitally filtering comprises the substep of digitally filtering said digitized demodulated electrical signal on a recursive basis to convolve it with a window N samples wide, N being a positive integer at least two; and further comprises the substeps of:

combining, with each sample of said demodulated electrical signal, as windowed by said rectangular window N samples wide, during each of which k calculations a respective one of k spectral components of the discrete Fourier transform of said demodulated electrical signal is calculated, said k spectral components having respective consecutive ordinal numbers selected from the consecutive ordinal numbers zeroeth through (N−1)th;

combining, with said latched sample of said demodulated electrical signal, a respective complex number during each of said k successive calculations, said respective complex number identified by the same ordinal number as said successive calculation, thereby to generate a sample of the correspondingly numbered one of said separated complex digital spectral components; and respectively multiplying each of said complex digital spectral components by a respective Nth root of unity to generate the next complex-number sample of said respective other signal identified by the same ordinal number as said digital spectral component being separated;

squaring an absolute value of each of the complex digitized spectral components to generate digital electric signals descriptive of the power spectrum of the interaction of said vibratory energy with said target;

performing a comparative analysis of said digital electric signals descriptive of the power spectrum of the interaction of said vibratory energy with said target; and calculating the velocity of said target from the results of the comparative analysis of said digitized spectral components.

10. The method for determining the velocity of a target of claim 9 wherein said substep of digitally filtering said digitized demodulated electrical signal on a recursive basis to convolve it with a window N samples wide consists of a substep of digitally filtering said digitized demodulated electrical signal on a recursive basis to convolve it with a rectangular window N samples wide.

11. The method for determining the velocity of a target of claim 9 wherein said substep of digitally filtering said digitized demodulated electrical signal on a recursive basis to convolve it with a window N samples wide consists of a substep of digitally filtering said digitized demodulated electrical signal on a recursive basis to convolve it with a triangular window N samples wide.

12. The method for determining the velocity of a target of claim 9 wherein in each said substep of multiplying the Nth root of unity is chosen to be $e^{-j2\pi k/N}$, with k being the ordinal number of said digital spectral component being multiplied.

13. An apparatus for determining the velocity of a target located in a medium comprising:
a) master clock for creating timing pulses;
b) pulse repetition frequency generator (PRF) responsive to the master clock for creating a start pulse from the timing pulses;
c) transmitter responsive to the PRF for transmitting pulses of coherent vibratory energy into said medium beginning when a start pulse is received;
d) receiving transducer for receiving vibratory energy reflected from said target in said medium and creating an echo signal;
f) time-gain control (TGC) generator coupled to the PRF for creating a gain control signal corresponding to a received start pulse;
e) amplifier coupled to the receiving transducer and responsive to the TGC generator for amplifying the echo signal from the receiving transducer with a gain corresponding to the gain control signal;
f) band pass filter coupled to the amplifier for filtering the amplified echo signal;

g) phase shift unit for receiving the filtered amplified echo signal and creating a shifted signal;
h) a range delay responsive to the PRF generator for creating a range gating signal corresponding to a received start pulse;
i) first processing branch for receiving the filtered amplified echo signal and creating a real signal component r(t);
j) second processing branch for receiving the shifted signal and creating an imaginary signal component i(t);
k) recursive digital filter coupled to the first and second processing branches for creating a signal representing a complex digital Fourier transform (DFT) having a plurality of spectral components of the real signal component r(t) and imaginary signal component i(t) in real time;
l) spectral component unit coupled to the recursive digital filter for creating a signal representing the amplitude of each spectral component; and
m) velocity calculation means coupled to the spectral component unit for determining said velocity of said target in said medium from the signal representing the amplitude of each spectral component.

14. The apparatus for determining the velocity of a target of claim 13 wherein the first processing branch comprises:
a) first demodulator for creating a demodulated signal from the filtered amplified echo signal;
b) first filter coupled to the first demodulator for filtering the demodulated signal;
c) first sample and hold unit coupled to the first filter and the range delay for receiving the filtered demodulated signal, sampling the filtered demodulated signal and holding the signal without substantial loss in intensity for a predetermined period of time according to the range gating signal;
d) first high-pass filter coupled to the first sample and hold unit for removing the low frequency components of the sampled signal; and
e) first analog-to-digital converter coupled to the first high-pass filter for digitizing the filtered sampled signal.

15. The apparatus for determining the velocity of a target of claim 13 wherein the second processing branch comprises:
a) second demodulator for creating a shifted demodulated signal from the shifted signal;
b) second filter coupled to the second demodulator for filtering the shifted demodulated signal;
c) second sample and hold unit coupled to the second filter and the range delay for receiving filtered demodulated signal, sampling the filtered shifted demodulated signal to create a sampled shifted signal and holding the signal without substantial loss in intensity for a predetermined period of time according to the range gating signal;
d) second high-pass filter coupled to the second sample and hold unit for removing the low frequency components of the sampled shifted signal; and
e) second analog-to-digital converter coupled to the second high-pass filter for digitizing the filtered sampled shifted signal.

* * * * *